US011661337B2

(12) United States Patent
Chen et al.

(10) Patent No.: US 11,661,337 B2
(45) Date of Patent: May 30, 2023

(54) COMB ELECTRODE RELEASE PROCESS FOR MEMS STRUCTURE

(71) Applicant: Taiwan Semiconductor Manufacturing Co., Ltd., Hsinchu (TW)

(72) Inventors: Ting-Jung Chen, Kaohsiung (TW); Lee-Chuan Tseng, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 3 days.

(21) Appl. No.: 17/176,353

(22) Filed: Feb. 16, 2021

(65) Prior Publication Data

US 2022/0119247 A1 Apr. 21, 2022

Related U.S. Application Data

(60) Provisional application No. 63/093,357, filed on Oct. 19, 2020.

(51) Int. Cl.
*B81C 1/00* (2006.01)
*H01L 21/48* (2006.01)

(52) U.S. Cl.
CPC ...... *B81C 1/00166* (2013.01); *B81C 1/00031* (2013.01); *H01L 21/4857* (2013.01)

(58) Field of Classification Search
CPC ............ B81C 1/00166; B81C 1/00031; B81C 1/00476; B81C 1/0015; B81C 1/00468;
(Continued)

(56) References Cited

U.S. PATENT DOCUMENTS 5,719,073 A * 2/1998 Shaw .................... B81C 1/0015
216/2
8,973,250 B2 * 3/2015 Jahnes .................. B81C 1/0015
29/609.1
(Continued)

FOREIGN PATENT DOCUMENTS

JP           H1141054 A   *  2/1999
JP           2001091262 A  *  4/2001
WO           2020104998 A1    11/2019

OTHER PUBLICATIONS

Machine translation of JP 2001091262 A, 2001.*
Machine translation of JP H1141054A, 1999.*

*Primary Examiner* — Shahed Ahmed
*Assistant Examiner* — Sun Mi Kim King
(74) *Attorney, Agent, or Firm* — Eschweiler & Potashnik, LLC

(57) ABSTRACT

An integrated circuit (IC) device includes: a first substrate; a dielectric layer disposed over the first substrate; and a second substrate disposed over the dielectric layer. The second substrate includes anchor regions comprising silicon extending upwards from the dielectric layer, and a series of interdigitated fingers extend from inner sidewalls of the anchor regions. The interdigitated fingers extend generally in parallel with one another in a first direction and have respective finger lengths that extend generally in the first direction. A plurality of peaks comprising silicon is disposed on the dielectric layer directly below the respective interdigitated fingers. The series of interdigitated fingers are cantilevered over the plurality of peaks. A first peak is disposed below a base of a finger and has a first height, and a second peak is disposed below a tip of the finger and has a second height less than the first height.

20 Claims, 11 Drawing Sheets

(58) Field of Classification Search
CPC ........ B81C 1/00023; B81C 2201/0102; B81C 1/00698; H01L 21/4857; B81B 2203/0136; B81B 7/02; B81B 2201/0235; B81B 3/0086; B81B 2201/033
See application file for complete search history.

(56) References Cited

U.S. PATENT DOCUMENTS

| | | |
|---|---|---|
| 2013/0156993 A1* | 6/2013 | Czabaj ................ B81C 1/00246 216/13 |
| 2014/0197502 A1 | 7/2014 | Dehe |
| 2014/0264873 A1 | 9/2014 | Ting et al. |
| 2017/0096328 A1 | 4/2017 | Tseng et al. |
| 2020/0135789 A1 | 4/2020 | Cheng et al. |

* cited by examiner

COMB ELECTRODE RELEASE PROCESS FOR MEMS STRUCTURE

REFERENCE TO RELATED APPLICATION

This Application claims the benefit of U.S. Provisional Application No. 63/093,357, filed on Oct. 19, 2020, the contents of which are hereby incorporated by reference in their entirety.

BACKGROUND

Microelectromechanical systems (MEMS) devices are becoming increasingly common in modern day devices (e.g., accelerometers, gyroscopes, microphones, smart speakers, hearing aids, camera devices). Many MEMS devices may be classified as a sensor or an actuator. Some MEMS sensors sense the presence of an external condition (e.g., acceleration, sound waves, light, magnetic signals) and convey the presence of that condition into an electrical signal (e.g., voltage, current). Some MEMS sensors, such as accelerometers or gyroscopes, can use a comb structure which utilizes electrostatic principles to detect changes in movement or pressure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
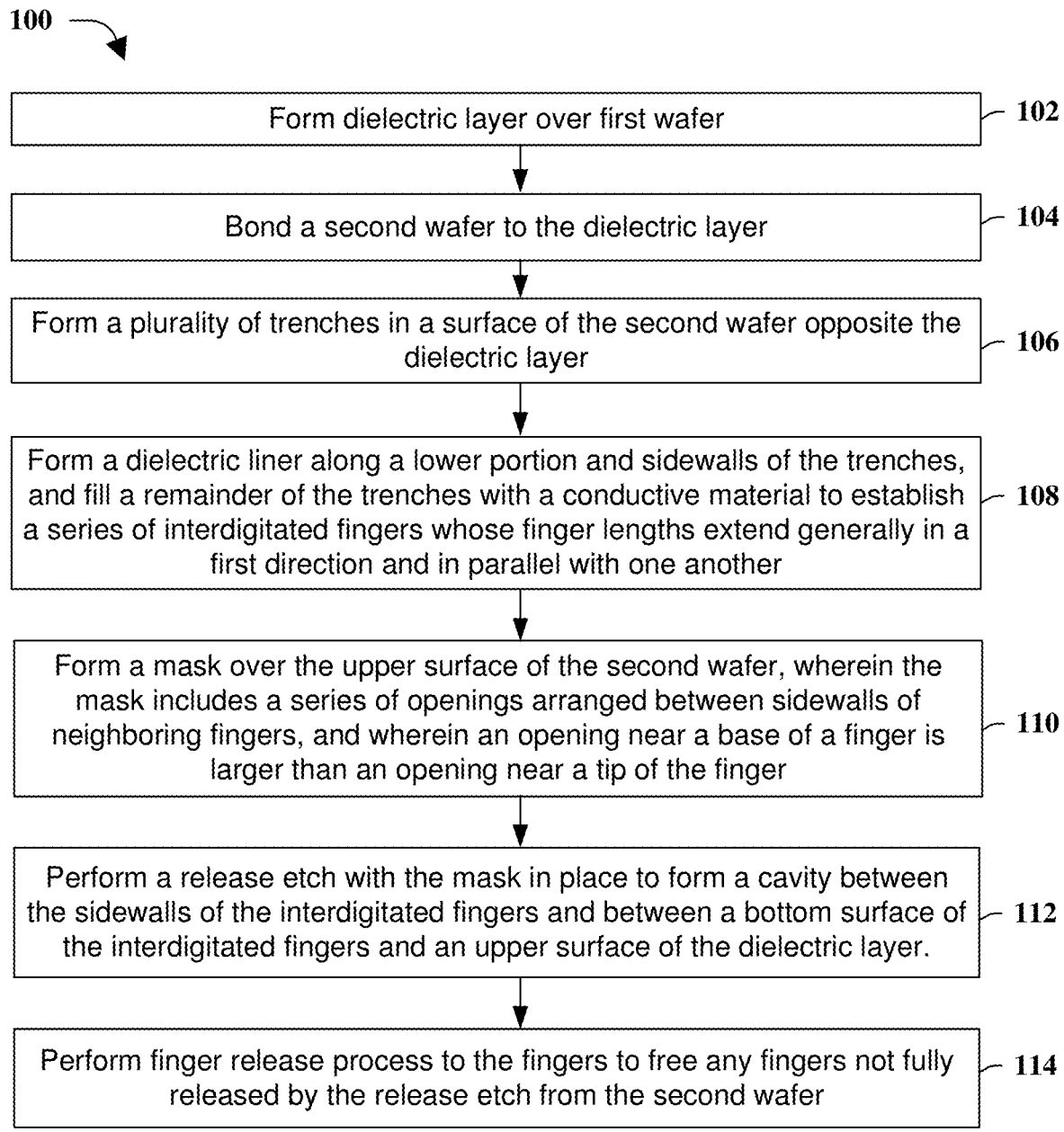
FIG. 1 illustrates a flow diagram of some embodiments corresponding to a method of forming a MEMS structure.
Figure 2A:
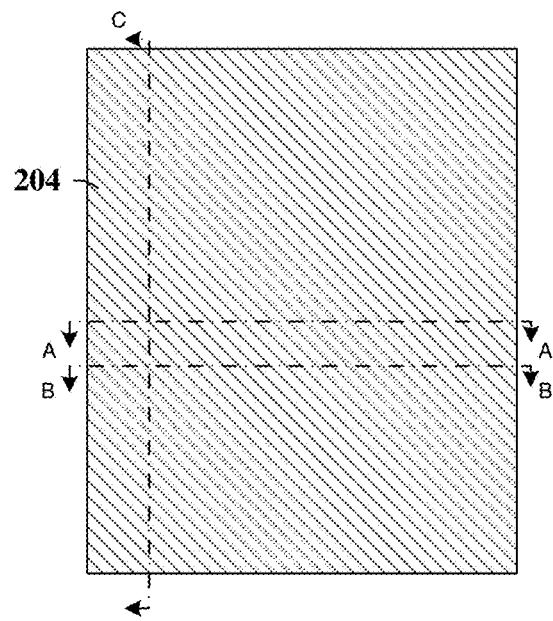
FIGS. 2A-2D through 8A-8F provide a series of top views, cross-sectional views, and perspective views that illustrate some embodiments of a method for making an IC device consistent with FIG. 1.
Figure 2D:
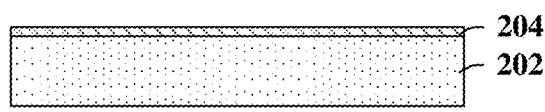
Figure 2B:
Figure 2C:
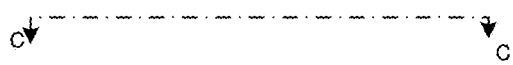
Figure 3A:
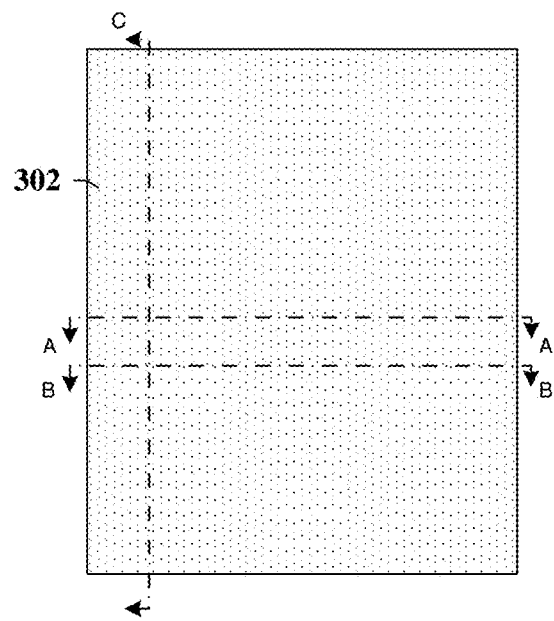
Figure 3D:
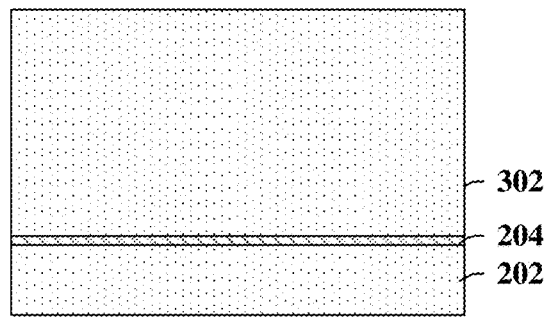
Figure 3B:
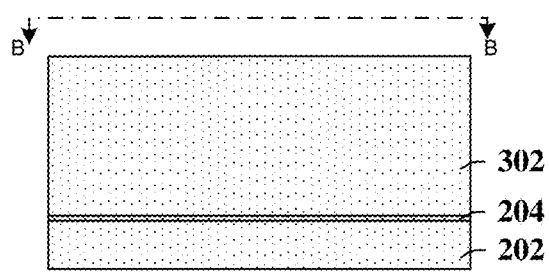
Figure 3C:
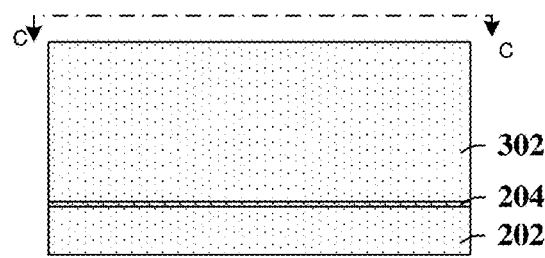
Figure 4A:
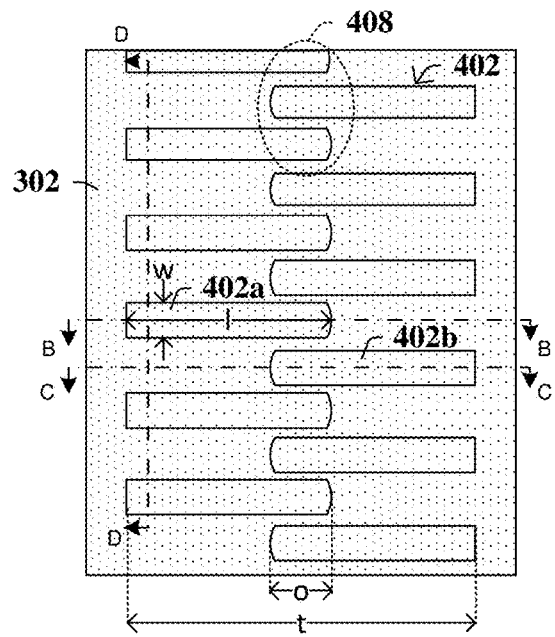
Figure 4D:
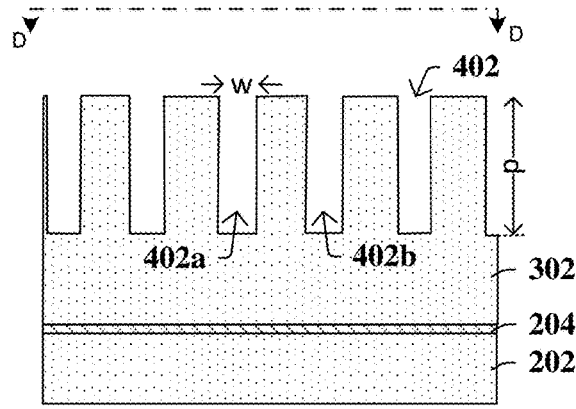
Figure 4B:
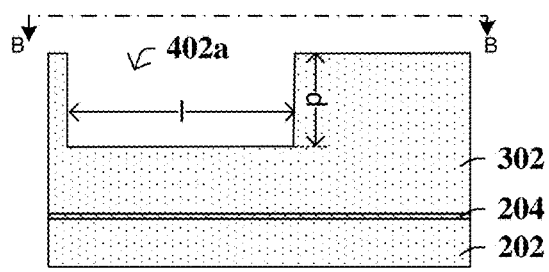
Figure 4C:
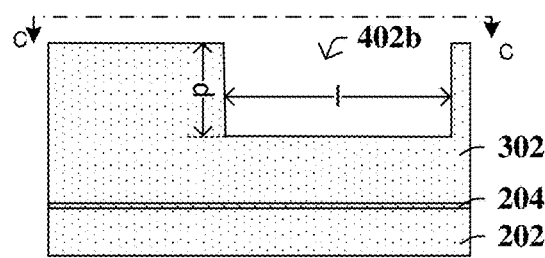
Figure 5A:
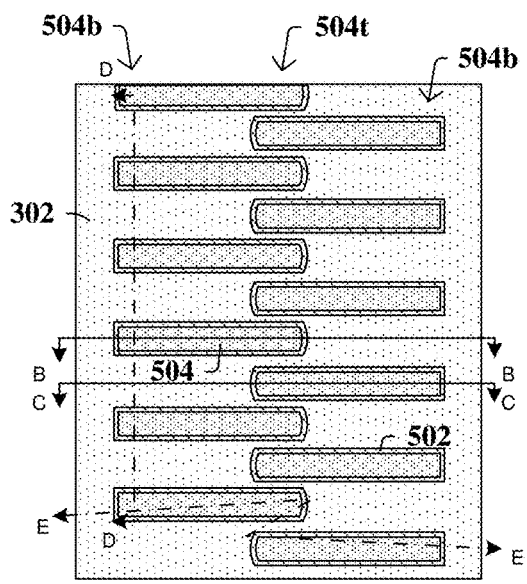
Figure 5D:
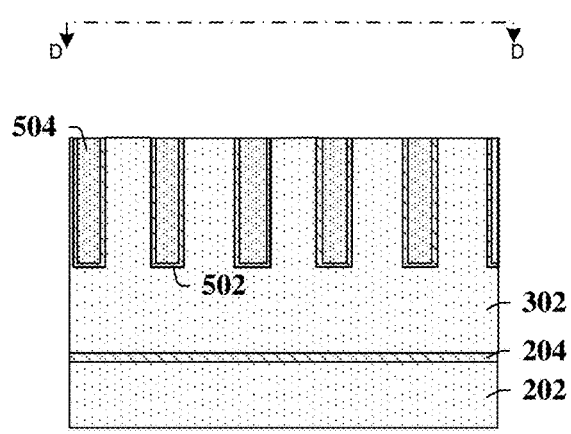
Figure 5B:
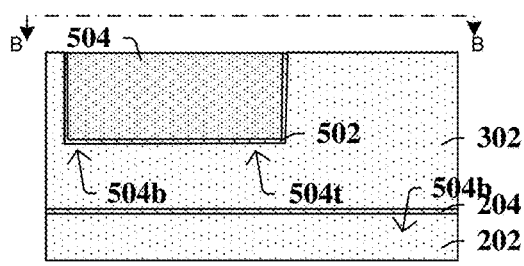
Figure 5E:
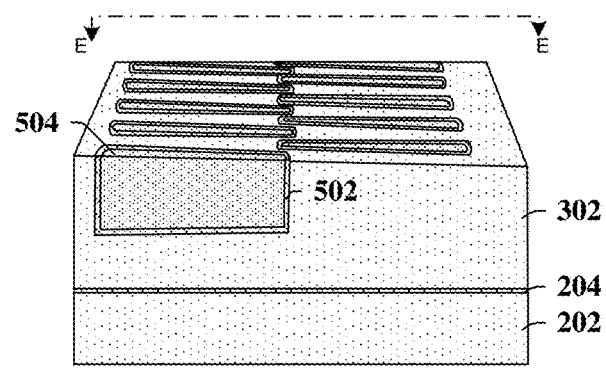
Figure 5C:
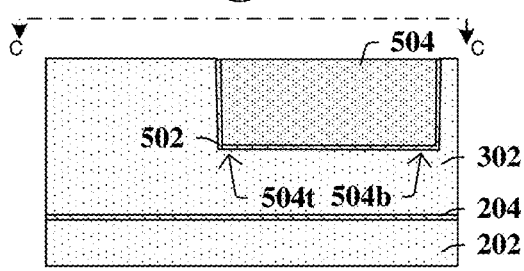

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A microelectromechanical system (MEMS) structure may be used in devices such as, for example, accelerometers, gyroscopes, and/or optical image stabilizer systems in cameras, such as for cell phones. A MEMS structure can include a first comb structure and a second comb structure that are arranged such that fingers of the first comb are interdigitated with fingers of the second comb and fingers of both the first and second comb lie on a plane. During operation, the first comb may remain fixed along the plane while the second comb may slide along the plane relative to the first comb, for example due to an acceleration experienced by the MEMS structure, causing the distances between the fingers of the first and second combs to shift. This shift in the distance between the fingers of the first and second combs can correspond to the acceleration experienced by the MEMS structure and can be detected by capacitive sensing techniques, thereby allowing detection of the acceleration. Sound or other conditions can also be detected in a similar way.

During manufacturing of the MEMS structure, fingers of the first comb and second comb are formed so as to be initially attached to other (e.g., underlying) structures of the substrate, and then are later freed from those other structures by the use of a release etch. In some cases, even after the release etch, some of the fingers may still be attached (i.e., "stuck") to the substrate due to small variations in the etch process over the wafer during manufacturing. To "rip" or "pry" any such stuck fingers from the substrate, a finger release process can be used to apply force to individual fingers (or to the comb structures as a whole). For example, for the force can be applied by mechanical techniques or electrostatic techniques. Regardless of the precise technique used to apply this force, some aspects of the present disclosure lie in the appreciation that if the tips of the fingers are still attached to the underlying substrate when the finger release process is applied, the force is much more likely to cause the fingers to break off. In some cases, this can leave the MEMS structure still functional but with a reduced sensitivity, while in other cases this can leave the MEMS structure non-operational.

Accordingly, various embodiments of the present disclosure relate to methods of forming a MEMS structure where the release etch is structured such that the tips of the fingers are released more cleanly/fully from the substrate than the bases of such fingers, such that if any portions of the fingers are "stuck" to the substrate it will be the bases of the fingers rather than the tips. Thus, when a finger release process is applied to the MEMS structure, the chances of fingers breaking is much smaller than if the tips of the fingers were still attached. In some embodiments, this is achieved by patterning a mask over the MEMS structure. The mask generally covers the fingers but has openings spaced over the gaps between the fingers, wherein the openings nearer the bases of the fingers are smaller than the openings nearer the tips of the fingers. The release etch is performed with this mask in place, such that the larger openings near the tips of the fingers promote more etching near the tips of the fingers to help ensure the tips of the fingers are more cleanly/fully released from the substrate. Again, this can help reduce the chances of fingers breaking and promotes better functionality for the final MEMS structure.

With reference to FIG. 1, one can see a method 100 of forming an integrated circuit in accordance with some embodiments. This methodology is now briefly described, and then some more specific embodiments will be described further below with regards to FIGS. 2A-2D through FIGS. 8A-8E, each of which shows a top view and a series of cross-sectional views consistent with the various acts of the method 100. More particularly, FIG. A of each figure shows a top view at each stage, FIGS. B-D of each figure show various cross-sectional views at each stage, and FIG. E (where applicable) shows a perspective cutaway view. It will be appreciated that although FIG. 1's methodology is described with regards to the examples of FIGS. 2A-2D through FIGS. 8A-8E that FIG. 1's method is not limited by these examples.

Referring now to FIG. 1, the method 100 begins at 102, wherein a dielectric layer is formed over a first wafer. At 104, a second wafer is bonded to the dielectric layer. At 106, a plurality of trenches are formed in a surface of the second wafer opposite the dielectric layer. At 108, a dielectric liner is formed along a lower portion and sidewalls of the trenches, and a remainder of the trenches is filled with a conductive material to establish a series of interdigitated fingers whose finger lengths extend generally in a first direction and in parallel with one another. At 110, a mask is formed over the upper surface of the second wafer, wherein the mask includes a series of mask openings arranged between sidewalls of neighboring fingers, and wherein a mask opening near a base of a finger is smaller than a mask opening near a tip of the finger. At 112, an etch is performed with the mask in place to form a cavity between the sidewalls of the interdigitated fingers and between bottom surfaces of the interdigitated fingers and an upper surface of the dielectric layer. At 114, a finger release process is applied to the fingers to free any fingers not fully released by the release etch from the second wafer. Because the release etch is performed with the mask in place, and the mask has larger openings near the tips of the fingers, the release etch and mask promote more etching near the tips of the fingers to help ensure the tips of the fingers are more cleanly/fully released from the substrate. Again, this can help reduce the chances of fingers breaking during the finger release process and promotes better functionality for the final MEMS structure.

With reference to FIGS. 2A-2D through 8A-8E, various views of some embodiments of a semiconductor structure at various stages of manufacture are provided to illustrate the method of FIG. 1. Although FIGS. 2A-2D through 8A-8E are described in relation to the method 100 of FIG. 1, it will be appreciated that the structures disclosed in FIGS. 2A-2D through 8A-8E are not limited to the method 100, but instead may stand alone as structures independent of the method 100. Similarly, although the method 100 of FIG. 1 is described in relation to FIGS. 2A-2D through 8A-8E, it will be appreciated that the method 100 is not limited to the structures disclosed in FIGS. 2A-2D through 8A-8E, but instead may stand alone independent of the structures disclosed in FIGS. 2A-2D through 8A-8E.

FIGS. 2A-2D, which are consistent with some embodiments of 102 of FIG. 1, illustrate a dielectric layer 204 that is formed over a first wafer 202. In some embodiments, the first wafer is a first monocrystalline silicon wafer or a semiconductor-on-insulator (SOI) wafer. In some embodiments, the dielectric layer 204 is a silicon dioxide layer, a silicon nitride layer, a silicon oxynitride layer, or another dielectric layer. In some embodiments, the dielectric layer 204 is formed by a thermal oxidation process, such as a wet thermal oxidation process or a dry thermal oxidation process. During such oxidations, the first wafer 202 is placed in a furnace and heated to a temperature typically ranging between 800° Celsius and 1200° Celsius in the presence of oxygen to form the dielectric layer. In other embodiments, the dielectric layer 204 can be formed by a spin-on process, or by plasma vapor deposition, chemical vapor deposition, atomic layer deposition, or other techniques.

FIGS. 3A-3D, which are consistent with some examples of 104 of FIG. 1, illustrate a second wafer 302, such as a monocrystalline silicon wafer, that has been bonded to the dielectric layer 204. In some embodiments, the second wafer 302 is bonded to a top surface of the dielectric layer 204 through a fusion bonding process. In other embodiments, rather than bonding the first and second wafers to one another, acts 102 and 104 can be achieved by receiving an SOI wafer, wherein the first wafer 202 corresponds to a handle portion of the SOI wafer, the dielectric layer 204 corresponds to an insulator layer of the SOI wafer, and the second wafer 302 corresponds to a device layer of the SOI wafer.

FIGS. 4A-4D, which are consistent with some examples of 106 of FIG. 1, illustrate a plurality of trenches 402 formed in a surface of the second wafer 302 opposite the dielectric layer 204. To form the trenches 402, a first mask can be formed over the upper surface of the second wafer 302, and with the first mask in place, an etch can be carried out. After etching, the trenches 402 have a length, l, in a first direction along the surface of the second wafer 302, and have a width, w, in a second direction that is perpendicular to the first direction. The trenches 402 extend generally in parallel with one another in the first direction. Central regions 408 of the trenches overlap one another in the first direction, and ends of every other trench extend outwards in opposite directions from the central regions such that the trenches are interdigitated with one another. In some embodiments, a structure has a total length, t, in the first direction of approximately 50 micrometers to 1000 micrometers, and the central regions 408 that overlap one another have an overlapping distance, o, ranging from approximately 5% of the total length to approximately 99% of the total length, or ranging from approximately 30% to approximately 99% of the total length, or range from 50% to 99% of the total length. In some embodiments, the width, w, of the trenches 402 ranges from approximately 0.5 micrometers to approximately 10 micrometers. The trenches can also have a depth, d, ranging from approximately 50 micrometers to approximately 300 micrometers in some embodiments.

FIGS. 5A-5E, which are consistent with some examples of 108 of FIG. 1, illustrate some embodiments where a dielectric liner 502 is formed along a lower surface and sidewalls of the trenches 402. The dielectric liner 502 leaves a remainder of the trenches unfilled, and then the remainder of the trenches is filled with a conductive material to establish a series of interdigitated fingers 504 whose finger lengths extend generally in the first direction and in parallel with one another. The fingers 504 include base regions 504b on the outermost ends of the total length of the structure, and tip regions 504t in the central region where the fingers 504 overlap. In some embodiments, the dielectric liner 502 laterally surrounds the fingers 504 on all sides. Often, after the conductive material is formed, a chemical mechanical planarization (CMP) process is performed to remove excess dielectric liner and conductive material from over the trenches, and to planarize the upper surface of the dielectric liner 502 with the upper surface of the conductive material of the interdigitated fingers 504 and with the upper surface of the second wafer 302. In some embodiments, the dielectric liner 502 is formed by plasma vapor deposition and/or thermal oxidation, and comprises the same material as the dielectric layer 204. In some embodiments, the dielectric liner 502 comprises silicon dioxide, silicon nitride, silicon oxynitride, or another dielectric layer, and the conductive material of the fingers 504 comprises polysilicon or a metal.

FIGS. 6A-6E, which are consistent with some examples of 110 of FIG. 1, illustrate some embodiments where a mask 602 is formed over the upper surface of the second wafer 302. The mask 602 includes a series of openings 604 that are arranged over the second wafer 302 and between outer sidewalls of neighboring fingers. A first opening 604a near a tip of a finger has a first area that is larger than a second area of a second opening 604b near a base of the finger. In some embodiments, this variation in the areas of the openings 604 helps ensure the tips of the fingers are released more cleanly/fully from the second wafer 302 than the bases of such fingers, such that if any portions of the fingers are "stuck" to the second wafer 302 it will be the bases of the fingers rather than the tips. This is because the larger openings near the tips of the fingers promote more etching near and under the tips of the fingers to help ensure the tips of the fingers are more cleanly/fully released from the second wafer 302. Again, this can help reduce the chances of fingers breaking and promotes better functionality for the final MEMS structure. In some embodiments, the first opening 604a may have a first length, L1, the second opening 604b may have a second length, L2, and a third opening 604c may have a third length L3. Thus, in some embodiments, L1 is greater than L2, and L2 is greater than L3. Further still, the spacing between centers of the openings (e.g., the "pitch") can change along line B-B. Thus, as shown, as measured from a centerline 615 of the device, the first opening with length L1 can have a first central axis 617 spaced at distance d1 from the centerline 615, the second opening with length L2 can have a second central axis 619 spaced at distance d2 from the centerline 615, and the third opening with length L3 can have a third central axis 621 spaced at distance d3 from the centerline 615. In some embodiments, the central axes of these openings get closer together as the openings get nearer to the outer edges of the trenches. Thus, for example, d1 is more than half of d2 (or d2−d1<d1), and d3−d2<d2−d1<d1. In some embodiments, the openings can be symmetric and/or mirror-images of one another about the centerline 615, albeit the openings are shifted along line D-D on opposite sides of the centerline because of the interdigitated nature of the fingers.

Figure 6A:
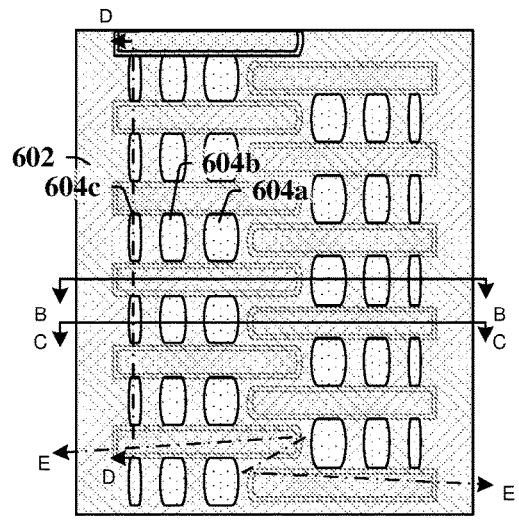
Figure 6D:
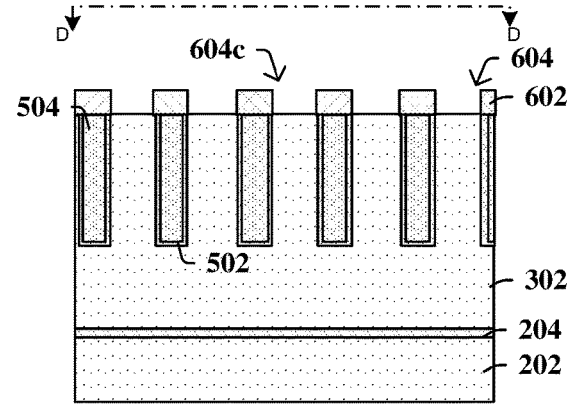
Figure 6B:
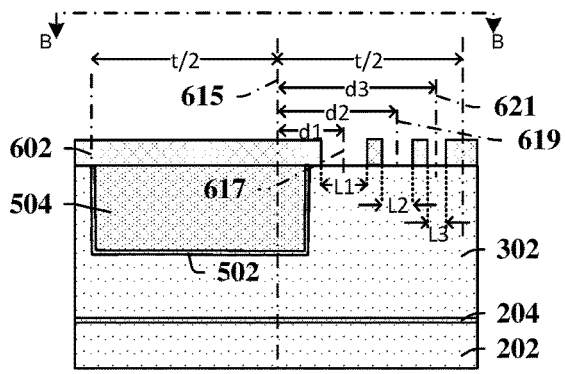
Figure 6E:
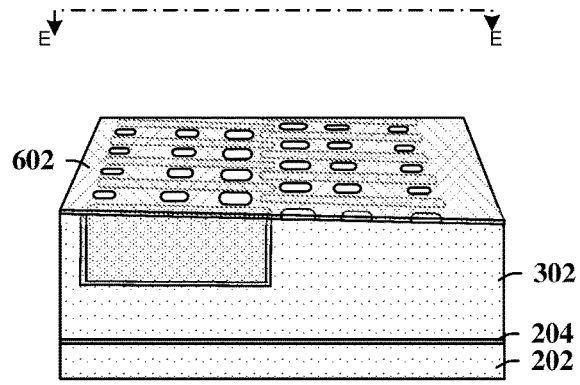
Figure 6C:
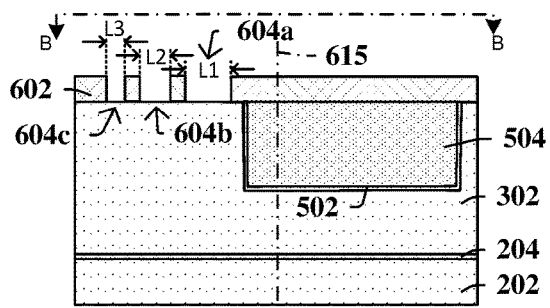
Figure 6F:
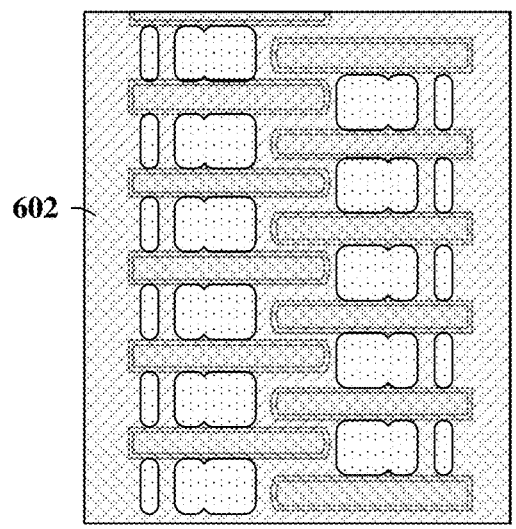
Figure 6G:
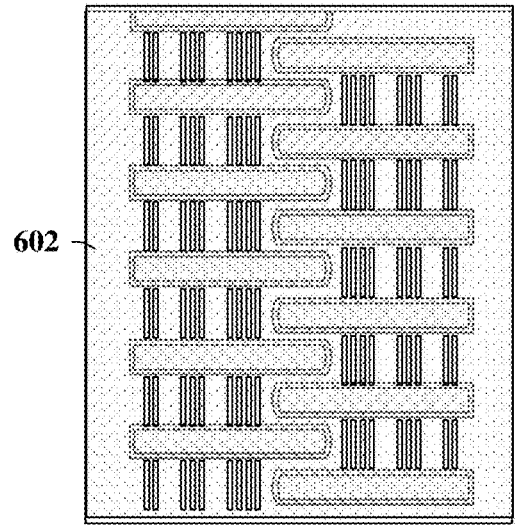
Figure 6H:
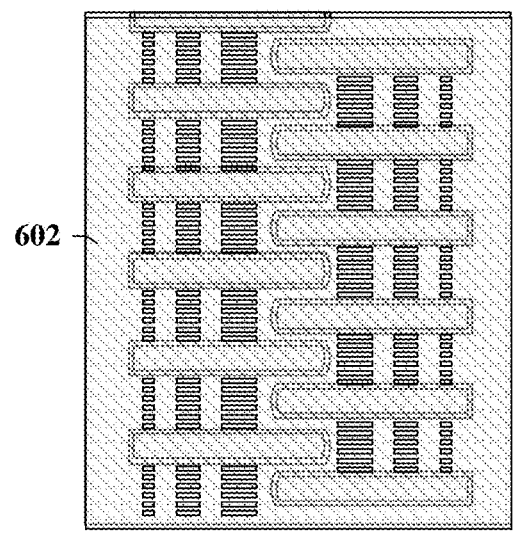
Figure 6I:
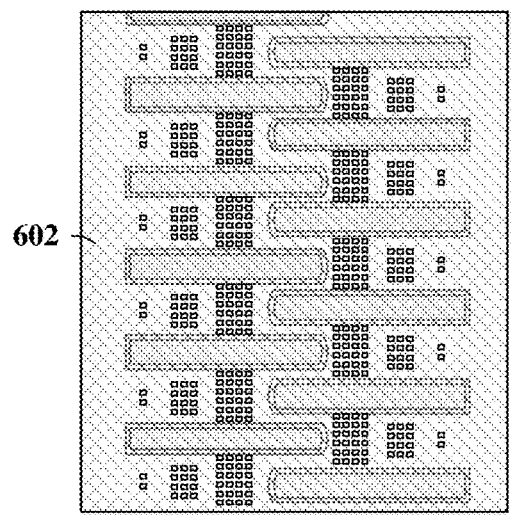

FIGS. 6F-6I show top-views of some examples of alternative embodiments for the mask 602. FIG. 6F shows an example where the mask openings nearer the tips of the fingers are "merged", such that an outer smaller, opening is near the base of the finger and a larger, inner opening is near a tip of the finger and has an upper scallop and a lower scallop along outer sidewalls of the fingers as viewed from above. FIG. 6G shows another example where a number of narrow mask openings (e.g., "slits") having equal dimensions and areas as one another are arranged so the effective mask opening area nearer the tips of the fingers is greater than the effective mask opening area nearer the bases of the fingers. In FIG. 6G, the mask openings are orientated perpendicular to the fingers. Though the example of FIG. 6G shows four slits that are spaced close together nearer the tips of the fingers, two slits near the base of the fingers, and three slits near the intermediate portions of the fingers, any number of slits could be present and this is merely an example. FIG. 6H shows another example where slits are oriented in parallel with the fingers, and where the slits have equal widths as one another but different lengths. In FIG. 6H, the lengths of the slits are longer nearer to the tips of the fingers and are shorter nearer to the bases of the fingers. FIG. 6I shows another example where an array of mask openings, each mask opening having a unit area, are arranged such that the effective mask opening area nearer the tips of the fingers is greater than an effective mask opening area near the base of the fingers.

Figure 7A:
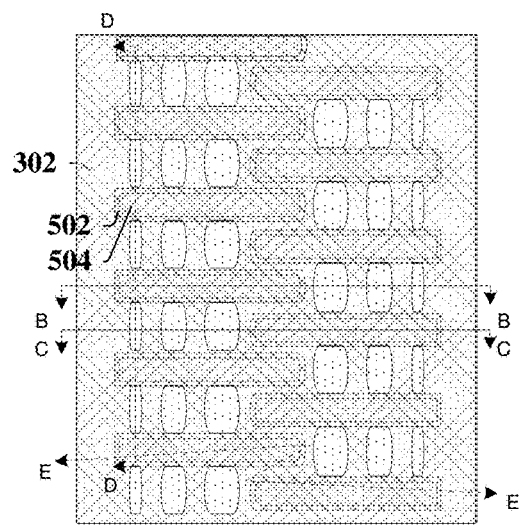
Figure 7D:
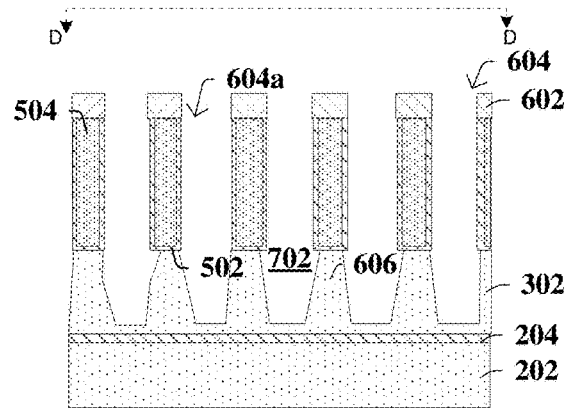
Figure 7B:
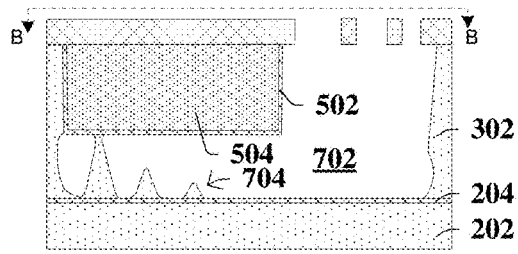
Figure 7E:
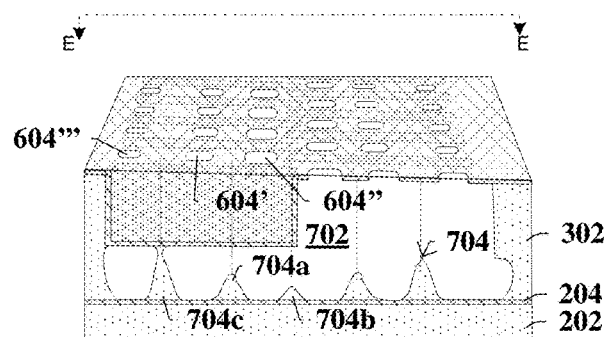
Figure 7C:
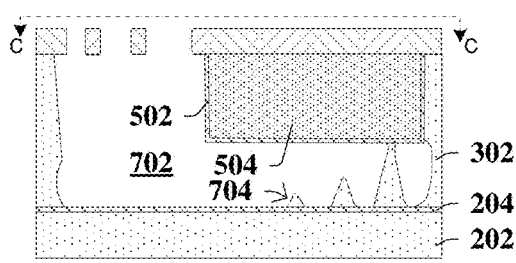

FIGS. 7A-7E and FIGS. 8A-8E are consistent with some examples of 112 of FIG. 1 where a release etch is performed. FIGS. 7A-7E illustrate an intermediary stage in some embodiments of the release etch and 8A-8E show the structure at the completion of the release etch. In some embodiments, the release etch is a hydro-fluoric acid (HF) etch, and can be an aqueous HF etch or a vapor HF etch. The release etch is selective in that it preferentially etches the second wafer 302 at a first etching rate while etching the dielectric layer 204 and dielectric liner 502 at a second etching rate less than the first etching rate. In FIGS. 7A-7E, with the mask 602 in place, the early portions of the release etch remove sections of the second wafer 302 beneath the openings in the mask 602 to form a cavity 702 between the sidewalls of the interdigitated fingers 504. As the etch progresses, the etch extends the cavity to continue below bottom surfaces of the interdigitated fingers 504 and to expose an upper surface of the dielectric layer 204. As shown in FIGS. 7A-7E, the release etch leaves semiconductor material of the second wafer as a series of peaks 704 directly under the bottom surfaces of the interdigitated fingers 504. However, because the mask openings near the bases of the fingers are smaller than mask openings near the tips of the fingers and/or the pitch of the mask openings near the bases of the fingers is smaller than the pitch of the mask openings near the tips of the fingers, the peaks near the base regions are larger and may remain attached to the bottom surfaces of the interdigitated fingers whereas the peaks near the tips of the fingers are fully released from the tips of the fingers. As shown in FIG. 7E, the peaks 704 are offset from the openings, and are approximately mid-way between adjacent openings, albeit a given opening may be shifted slightly closer to the larger opening of the two adjacent openings due to the manner in which the etch progresses. For example, in FIG. 7E, peak 704a is approximately mid-way between mask opening 604' and mask opening 604" in the first direction, and peak 704b is approximately midway between mask opening 604' and mask opening 604''' in the first direction. In addition, in the first direction, peak 704b may be located between adjacent peaks 704a.

Figure 8A:
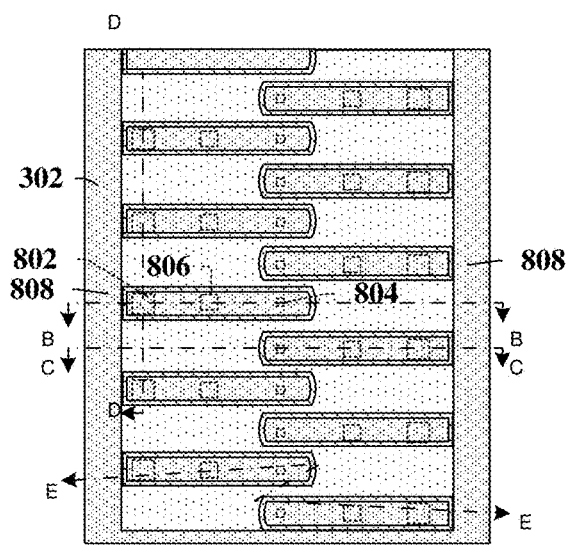
Figure 8B:
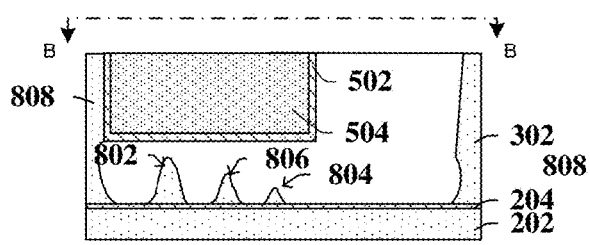
Figure 8C:
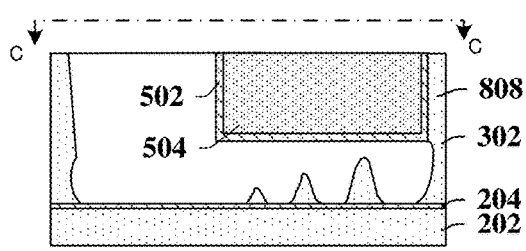
Figure 8D:
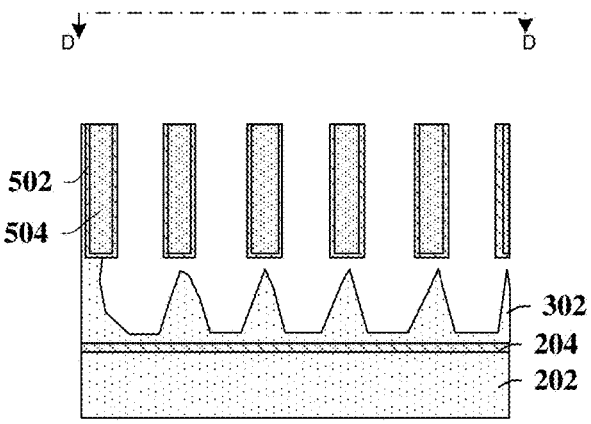
Figure 8E:
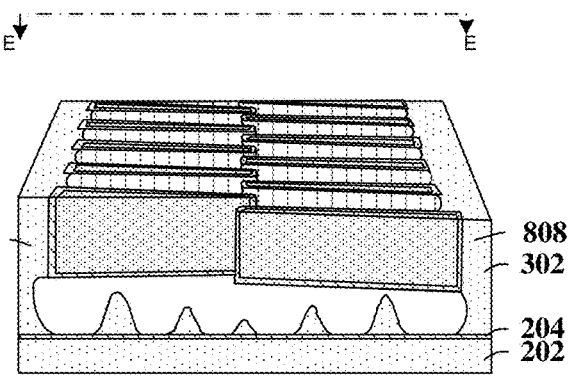

FIGS. 8A-8E show the structure after the release etch is complete. In these examples, anchor regions 808 comprising silicon extending upwards from the dielectric layer 204. The conductive fingers 504, which are interdigitated with one another, extend inwards from inner sidewalls of the anchor regions 808 and are cantilevered over the dielectric layer 204. The dielectric liner 502 covers sidewalls and bottom surfaces of the conductive fingers 504, and peaks, which are made of semiconductor material, are disposed on the dielectric layer 204. The peaks are spaced apart from one another, but still remain under the conductive fingers 504. As can be seen in FIGS. 8B, 8C, and 8E, in the first direction (e.g., x-direction), the groups of peaks are located directly below the fingers with peaks of each group along this direction having different heights from one another. Thus, a first peak 802 under the base of the finger has a first height that is larger than a second height of a second peak 804 under the tip of the finger, and a third peak 806 under an intermediate portion of the finger has a third height that is between the first height and the second height. As viewed from above (see e.g., FIG. 8A), the peaks may be square, rectangular, or polygonal, and may have rounded corners (e.g., circular or oval). In some embodiments, the first peak 802 may have a height ranging from 0.1 micrometers to 100 micrometers; and the second peak 804 may have a height ranging from 0.0999 micrometers to 99.9 micrometers. In some embodiments, a ratio of height of the first peak to the height of the second peak can range from 0.999 to 100. Further, as can be seen in FIG. 8D, in the second direction (e.g., y-direction) other groups of peaks have the same heights as one another. Thus, as shown in FIG. 8D, peaks that are located directly below bases of different fingers each have substantially the same height. It will be appreciated that "substantially the same height" contemplates that there may be small variations in height due to small fluctuations in the etch process, but the resulting heights are still typically within 1% of one another.

In some embodiments, such as shown in FIGS. 8B and 8C, the peaks under a single finger 504 along the length of that finger have heights that monotonically decrease from the first peak (e.g., 802) under the base of the finger to the second peak (e.g., 804) under the tip of the finger. Further, because of variations in the manufacturing process, some small number of fingers in the MEMS device may still be attached to the underlying peaks after the release etch is performed. When attached, however, the peaks are attached at the base of the fingers rather than the tips. Hence, when a finger release process is applied to the fingers to free any fingers not fully released by the release etch from the underlying peaks (e.g., 114 in FIG. 1), the fingers 504 are much more likely to remain intact then with previous approaches. Accordingly, manufacturing yield and device sensitivity is improved.

Figure 8F:
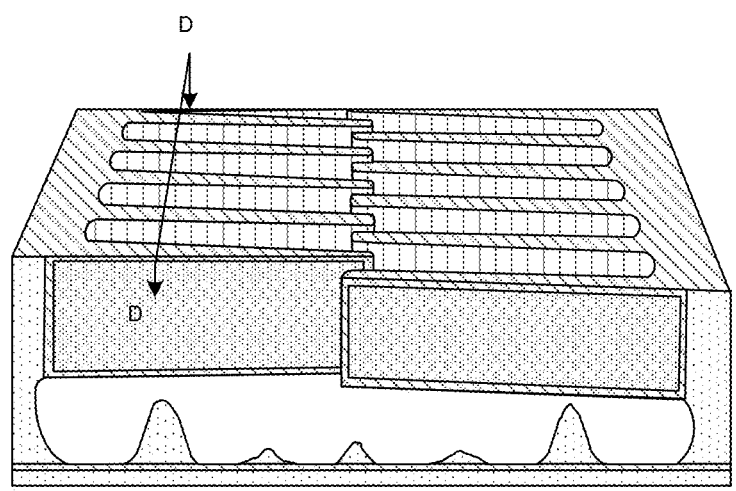

In other embodiments, such as shown in FIG. 8F, the peaks under a single finger 504 along the length of that finger have heights that decrease from the first peak (e.g., 802) under the base of the finger to the third peak (e.g., 806) under an intermediate portion of the finger, and then again increase in height for the second peak 804 at the tip of the finger. The height of the second peak 804 is still less than the height of the first peak 802.

It will be appreciated that FIGS. 2A-8F are described with regards to a first wafer and a second wafer, that typically at some stage of manufacturing the first and second wafers are diced along scribe lines that separate dies on the first and second wafers, thereby forming individual integrated circuits. Thus, whereas during the manufacturing process prior to dicing the first and second wafers are referred to as "wafers", after the dicing the diced sections can be referred to as "substrates". These terms are interchangeable in some regards in that a wafer, which may suggests a circular or disk-like structure, can also manifest as other shapes and therefore can also include many types of substrate.

Figure 9:
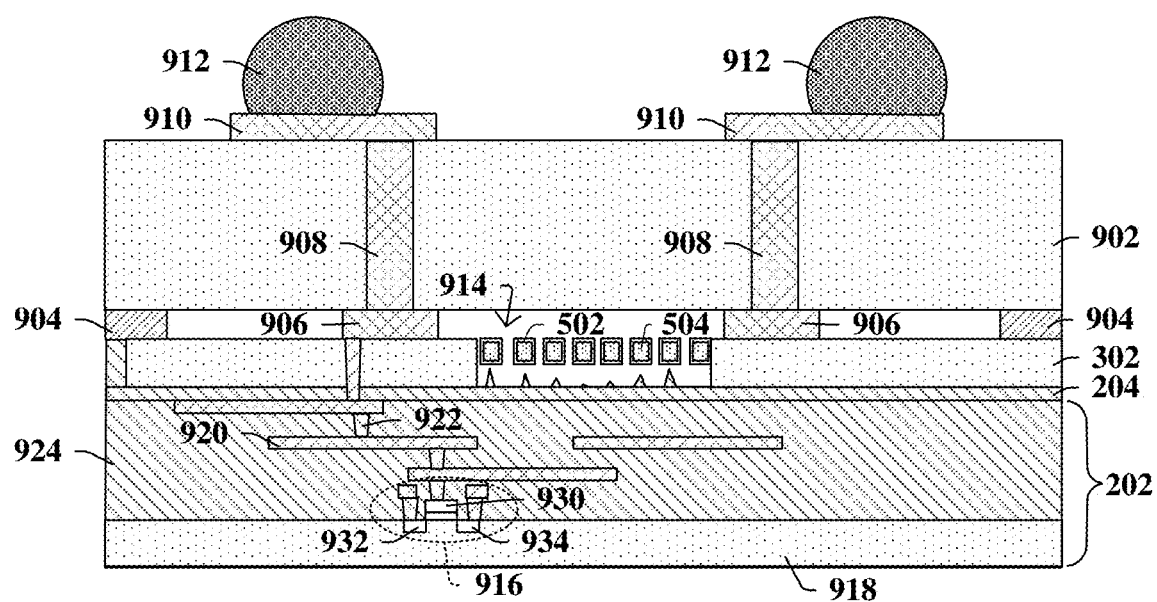
FIG. 9 illustrates a cross-sectional view of another IC device in accordance with some embodiments.

In some embodiments, such as shown in FIG. 9, a third wafer/substrate 902, which may be referred to as a capping wafer/substrate, is bonded to a face of the second wafer/substrate 302 opposite the dielectric layer 204. In FIG. 9, the capping wafer/substrate 902 includes a third semiconductor substrate that is bonded to the second wafer/substrate by one or more sealing rings 904. In some embodiments, the one or more sealing rings 904 is or otherwise includes, for example, aluminum copper, and/or germanium. In some embodiments, the sealing rings are eutectic sealing rings, and can comprise a first ring comprising aluminum copper, and a second ring stacked over or below the first ring and comprising germanium. Further, one or more first bond pads 906, such as copper or copper aluminum bond pads, can electrically and physically couple the second wafer/substrate 302 to the third wafer/substrate 902. Through substrate vias (TSVs) 908 may pass through the third wafer/substrate 902 and couple the first bond pads 906 to second bond pads 910. Conductive bumps 912, which can comprise solder, can be disposed on the second bond pads 910. As can be seen, the capping wafer/substrate 902, second wafer/substrate 302, and dielectric layer 204 collectively establish an enclosed cavity 914 in which the conductive fingers 504 reside. This cavity 914 can be filled with gas, such as air or nitrogen, or vacuum. In some embodiments, the first wafer 202, which can be referred to as a CMOS substrate in some cases, can include transistor devices 916 disposed on a semiconductor substrate 918, with an interconnect structure comprising metal lines 920 and vias 922 disposed in a dielectric structure 924 over the semiconductor substrate 918. The semiconductor substrate 918 can comprise monocrystalline silicon, the metal lines 920 and vias 922 can comprise copper and/or aluminum, and the dielectric structure 924 can comprise a low-k dielectric or silicon dioxide. The illustrated transistor devices 916 can include a conductive gate electrode 930 arranged between doped source/drain regions 932, 934, though other devices such as diodes, bipolar junction transistors (BJTs), or other active or passive devices could be disposed in the semiconductor substrate.

Some embodiments relate to a method of forming an integrated circuit (IC) device. In the method, a dielectric layer is formed over a first wafer. A second wafer is provided on the dielectric layer, and a plurality of trenches are formed in a surface of the second wafer opposite the dielectric layer. A dielectric liner is formed along a lower portion and sidewalls of the trenches, and a remainder of the trenches is filled with a conductive material to establish a series of interdigitated fingers whose finger lengths extend generally in a first direction and in parallel with one another. A mask is formed over the upper surface of the second wafer. The mask includes a series of openings arranged between sidewalls of neighboring fingers, wherein a first opening near a base of a finger has a first area that is larger than a second area of a second opening near a tip of the finger. An etch is performed with the mask in place to form a cavity between the sidewalls of the interdigitated fingers and between bottom surfaces of the interdigitated fingers and an upper surface of the dielectric layer.

An integrated circuit (IC) device includes: a first substrate; a dielectric layer disposed over the first substrate; and a second substrate disposed over the dielectric layer. The second substrate includes anchor regions comprising silicon extending upwards from the dielectric layer, and a series of interdigitated fingers extend from inner sidewalls of the anchor regions. The interdigitated fingers extend generally in parallel with one another in a first direction and have respective finger lengths that extend generally in the first direction. A plurality of peaks comprising silicon is disposed on the dielectric layer directly below the respective interdigitated fingers. The series of interdigitated fingers are cantilevered over the plurality of peaks. A first peak is disposed below a base of a finger and has a first height, and a second peak is disposed below a tip of the finger and has a second height less than the first height.

Still other embodiments relate to an integrated circuit (IC) device. The IC device includes a complementary metal oxide semiconductor (CMOS) substrate including a plurality of semiconductor devices disposed in the CMOS substrate. An interconnect structure is disposed over the CMOS substrate, and a dielectric layer is disposed over the interconnect structure. A micro-electrical-mechanical-system (MEMS) substrate is disposed over the dielectric layer. The MEMS substrate includes anchor regions comprising silicon extending upwards from the dielectric layer, and a plurality of conductive fingers are interdigitated with one another and cantilevered over the dielectric layer. A capping substrate is disposed over the MEMS substrate and establishes a cavity in which the conductive fingers are arranged. A lower surface of the cavity is defined by an upper surface of the dielectric layer, and a plurality of peaks comprising silicon are disposed on the dielectric layer directly below the plurality of fingers, respectively. A first peak of the plurality of peaks is disposed below a base of a finger and has a first height, and a second peak of the plurality of peaks is disposed below a tip of the finger and has a second height less than the first height.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit (IC) device, the method comprising:
   forming a dielectric layer over a first wafer;
   providing a second wafer on the dielectric layer;
   forming a plurality of trenches in an upper surface of the second wafer opposite the dielectric layer;
   forming a dielectric liner along a lower portion and sidewalls of the plurality of trenches, and filling a remainder of the plurality of trenches with a conductive material to establish a series of interdigitated fingers whose finger lengths extend generally in a first direction and in parallel with one another;
   forming a mask over the upper surface of the second wafer, wherein the mask includes a series of openings arranged between outer sidewalls of neighboring fingers, and wherein a first opening near a base of a finger has a first area that is smaller than a second area of a second opening near a tip of the finger; and
   performing an etch with the mask in place to form a cavity between the sidewalls of the interdigitated fingers and between bottom surfaces of the interdigitated fingers and an upper surface of the dielectric layer.

2. The method of claim 1, wherein the etch leaves material of the second wafer as a series of peaks on the upper surface of the dielectric layer, wherein a peak in the series of peaks is directly below the finger.

3. The method of claim 2, wherein a first group of peaks is located directly below the finger with peaks of the first group having different heights from one another, and wherein a first peak under the base of the finger has a first height that is larger than a second height of a second peak under the tip of the finger.

4. The method of claim 3, wherein the peaks of the first group have heights that monotonically decrease from the first peak under the base of the finger to the second peak under the tip of the finger.

5. The method of claim 3, wherein a second group of peaks is located directly below bases of neighboring fingers and is arranged generally in a second direction perpendicular to the first direction, wherein the second group of peaks each have the first height.

6. The method of claim 1, wherein the conductive material comprises polysilicon and the dielectric liner and dielectric layer comprise silicon dioxide.

7. The method of claim 1, further comprising, bonding a third wafer to a face of the second wafer opposite the dielectric layer.

8. A method comprising:
   receiving a semiconductor structure including a first substrate, a dielectric layer over the first substrate, and a second substrate over the dielectric layer, wherein the second substrate includes anchor regions comprising silicon extending upwards from the dielectric layer;
   performing an etch to remove portions of the second substrate to form a series of interdigitated fingers extending from inner sidewalls of the anchor regions, wherein the interdigitated fingers extend generally in parallel with one another in a first direction and have respective finger lengths that extend generally in the first direction; and
   wherein as the etch removes the portions of the second substrate, the etch forms a plurality of peaks corresponding to remaining portions of the second substrate, wherein the peaks comprise silicon disposed on the dielectric layer directly below the series of interdigitated fingers, respectively, wherein the series of interdigitated fingers are cantilevered over the plurality of peaks and wherein a first peak disposed below a base of a finger has a first height, and a second peak disposed below a tip of the finger has a second height less than the first height.

9. The method of claim 8, wherein the series of interdigitated fingers comprise a polysilicon core whose sidewalls and lower surface are covered by a dielectric liner.

10. The method of claim 8, wherein a group of peaks of the plurality of peaks are arranged along a first line directly under bases of multiple fingers and have substantially the same height as one another.

11. The method of claim 9, wherein substantially all of the plurality of peaks are disposed directly under the interdigitated fingers and there is an absence of peaks directly below openings between the interdigitated fingers.

12. The method of claim 9, wherein more than two peaks are disposed directly below the finger, such that a first peak under the base of the finger has a first height and a second peak under the tip of the finger has a second height less than the first height.

13. The method of claim 12, wherein additional peaks between the first peak and the second peak have respective heights such that the heights of the more than two peaks monotonically decrease from the first peak to the second peak.

14. The method of claim 9, wherein peaks located directly below bases of fingers are arranged generally in a second direction perpendicular to the first direction, wherein each of the peaks directly below the bases of the fingers have the first height.

15. A method comprising:
   receiving a complementary metal oxide semiconductor (CMOS) substrate including a plurality of semiconductor devices and an interconnect structure over the plurality of semiconductor device;

attaching a micro-electrical-mechanical-system (MEMS) substrate over the interconnect structure, wherein the MEMS substrate is separated from the interconnect structure by a dielectric layer and the MEMS substrate includes anchor regions comprising silicon extending upwards from the dielectric layer, wherein a plurality of conductive fingers that are interdigitated with one another and are cantilevered over the dielectric layer and wherein a plurality of peaks comprising silicon are disposed on the dielectric layer directly below the plurality of conductive fingers, respectively, wherein a first peak of the plurality of peaks is disposed below a base of a finger and has a first height, and a second peak of the plurality of peaks is disposed below a tip of the finger and has a second height less than the first height; and attaching a capping substrate over the MEMS substrate to establish a cavity in which the conductive fingers are arranged, where a lower surface of the cavity is defined by an upper surface of the dielectric layer.

16. The method of claim 15, wherein a dielectric liner surrounds sidewalls and a lower surface of the conductive fingers, wherein the dielectric liner has a first composition and the dielectric layer has a second composition, the second composition being the same as the first composition.

17. The method of claim 16, wherein a first group of the plurality of peaks have heights that monotonically decrease from the first peak under the base of the finger to the second peak under the tip of the finger.

18. The method of claim 17, wherein the conductive fingers extend generally in parallel with one another in a first direction, wherein a second group of the plurality of peaks is located directly below bases of the conductive fingers and is arranged generally in a second direction perpendicular to the first direction, wherein the second group of the plurality of peaks each have the first height.

19. The method of claim 15, wherein conductive material of the conductive fingers comprises polysilicon and the dielectric layer comprises silicon dioxide.

20. The method of claim 15, wherein there is an absence of peaks on the dielectric layer directly below openings between outer sidewalls of the interdigitated fingers.

* * * * *